United States Patent
Chiang et al.

(10) Patent No.: US 10,593,629 B2
(45) Date of Patent: Mar. 17, 2020

(54) SEMICONDUCTOR PACKAGE WITH A CONDUCTIVE CASING FOR HEAT DISSIPATION AND ELECTROMAGNETIC INTERFERENCE (EMI) SHIELD AND MANUFACTURING METHOD THEREOF

(71) Applicant: Powertech Technology Inc., Hsinchu County (TW)

(72) Inventors: Chia-Wei Chiang, Hsinchu County (TW); Li-Chih Fang, Hsinchu County (TW); Wen-Jeng Fan, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/030,826

(22) Filed: Jul. 9, 2018

(65) Prior Publication Data
US 2020/0013721 A1  Jan. 9, 2020

(51) Int. Cl.
*H01L 23/538* (2006.01)
*H01L 23/31* (2006.01)
(Continued)

(52) U.S. Cl.
CPC ........ *H01L 23/5389* (2013.01); *H01L 21/568* (2013.01); *H01L 21/6835* (2013.01); *H01L 23/13* (2013.01); *H01L 23/3128* (2013.01); *H01L 23/3675* (2013.01); *H01L 23/5386* (2013.01); *H01L 23/552* (2013.01); *H01L 24/19* (2013.01); *H01L 24/20* (2013.01); *H01L 24/32* (2013.01); *H01L 24/73* (2013.01); *H01L 24/83* (2013.01); *H01L 25/105* (2013.01); *H01L 25/50* (2013.01); *H01L 2221/68359* (2013.01); *H01L 2221/68381* (2013.01);
(Continued)

(58) Field of Classification Search
CPC combination set(s) only.
See application file for complete search history.

(56) References Cited

U.S. PATENT DOCUMENTS 9,385,098 B2   7/2016 Zhang et al.
2019/0051612 A1*  2/2019 Kim .................. H01L 24/19
(Continued)

FOREIGN PATENT DOCUMENTS

CN   106952884   7/2017
TW   I497679     8/2015
TW   I622149     4/2018

*Primary Examiner* — Andrew Q Tran
(74) *Attorney, Agent, or Firm* — JCIPRNET

(57) ABSTRACT

A semiconductor package and a manufacturing method thereof are provided. The semiconductor package includes a conductive casing, a semiconductor die, a conductive connector, an insulating encapsulant, a redistribution structure, and a first conductive terminal. The conductive casing has a cavity. The semiconductor die is disposed in the cavity of the conductive casing. The conductive connector is disposed on a periphery of the conductive casing. The insulating encapsulant encapsulates the conductive connector, the semiconductor die and the cavity. The redistribution structure is formed on the insulating encapsulant and is electrically connected to the conductive connector and the semiconductor die. The first conductive terminal is disposed in openings of the redistribution structure and is physically in contact with a portion of the conductive casing.

20 Claims, 6 Drawing Sheets

(51) Int. Cl.
  *H01L 23/00*      (2006.01)
  *H01L 21/56*      (2006.01)
  *H01L 25/10*      (2006.01)
  *H01L 25/00*      (2006.01)
  *H01L 23/367*     (2006.01)
  *H01L 23/552*     (2006.01)
  *H01L 21/683*     (2006.01)
  *H01L 23/13*      (2006.01)

(52) U.S. Cl.
  CPC ............... *H01L 2224/211* (2013.01); *H01L 2224/32245* (2013.01); *H01L 2224/73267* (2013.01); *H01L 2224/83005* (2013.01); *H01L 2225/1035* (2013.01); *H01L 2225/1058* (2013.01); *H01L 2225/1094* (2013.01); *H01L 2924/3025* (2013.01)

(56) References Cited

U.S. PATENT DOCUMENTS

| | | | |
|---|---|---|---|
| 2019/0164893 A1* | 5/2019 | Kim | H01L 23/5386 |
| 2019/0164895 A1* | 5/2019 | Kim | H01L 23/5389 |
| 2019/0164933 A1* | 5/2019 | Lee | H01L 25/0655 |

* cited by examiner

US 10,593,629 B2

SEMICONDUCTOR PACKAGE WITH A CONDUCTIVE CASING FOR HEAT DISSIPATION AND ELECTROMAGNETIC INTERFERENCE (EMI) SHIELD AND MANUFACTURING METHOD THEREOF

BACKGROUND OF THE INVENTION

Field of the Invention

The disclosure generally relates to a semiconductor package and a manufacturing method thereof, and in particular, to a semiconductor package having a conductive casing and a manufacturing method thereof.

Description of Related Art

Development of semiconductor package technology in recent years has focused on delivering smaller, more compact products with more densely packed components, resulting in shorter distances between semiconductor components. The higher density of electronic components leads to a buildup of heat generated by the components, and the shorter distances between the semiconductor components leads to greater cross electromagnetic interference. If not adequately addressed, both factors will lead to degradation in performance. Therefore, continuing to miniaturize the semiconductor package while adequately dissipating heat and shielding from electromagnetic interference (EMI) in order to maintain a high performance of the semiconductor package and of the semiconductor die within the semiconductor package is a challenge to researchers in the field.

SUMMARY OF THE INVENTION

The disclosure provides a semiconductor package and a manufacturing method thereof, and the semiconductor package is capable of effectively dissipating heat and reducing electromagnetic interference affecting a semiconductor die within the semiconductor package.

The disclosure provides a semiconductor package including a conductive casing, a semiconductor die, a conductive connector, an insulating encapsulant, a redistribution structure, and a first conductive terminal. The conductive casing has a cavity. The semiconductor die is disposed in the cavity of the conductive casing. The conductive connector is disposed on a periphery of the conductive casing. The insulating encapsulant encapsulates the conductive connector, the semiconductor die and the cavity. The redistribution structure is formed on the insulating encapsulant and is electrically connected to the conductive connector and the semiconductor die. The first conductive terminal is disposed in openings of the redistribution structure and is physically in contact with a portion of the conductive casing.

The disclosure provides a manufacturing method of a semiconductor package. The manufacturing method includes at least the following steps. A semiconductor die is disposed in a cavity of a conductive casing. A conductive connector is formed on a periphery of the conductive casing. An insulating encapsulant is formed to encapsulate the conductive casing, the semiconductor die and the cavity. A redistribution structure is formed on the insulating encapsulant. The redistribution structure is electrically coupled to the conductive connector and the semiconductor die. A first conductive terminal is formed in openings of the redistribution structure to be physically in contact with a portion of the conductive casing.

Based on the above, the conductive casing within the semiconductor package may effectively dissipate heat generated by the semiconductor die and other circuitry within the package. Moreover, the conductive casing may shield the semiconductor die from EMI. In addition, the first terminal penetrating through the redistribution structure to connect the conductive casing forms a direct path for transmitting electrical noise picked up by the conductive casing to ground. As a result, the performance of the semiconductor package may be further enhanced. The conductive connector provides for connecting further semiconductor packages disposed on the semiconductor package, and thereby enable package on package (PoP) stacked arrangements of semiconductor packages. As a result, the performance of PoP arrangements may also be further enhanced.

To make the above features and advantages of the present invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles presented in the disclosure. Identical or similar numbers refer to identical or similar elements throughout the drawings.

DESCRIPTION OF THE EMBODIMENTS

Figure 1A:
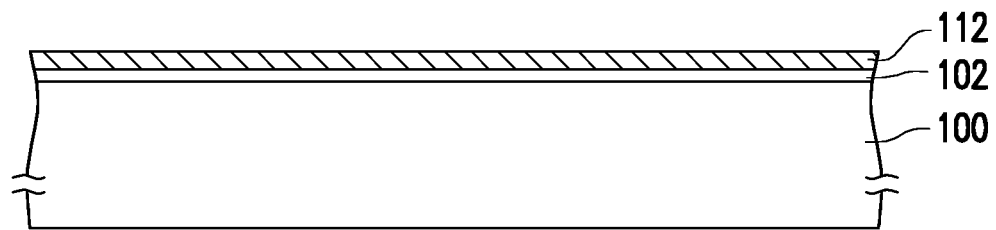
FIG. 1A to FIG. 1J are schematic cross-sectional views illustrating a manufacturing method of a semiconductor package according to some embodiments of the disclosure.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
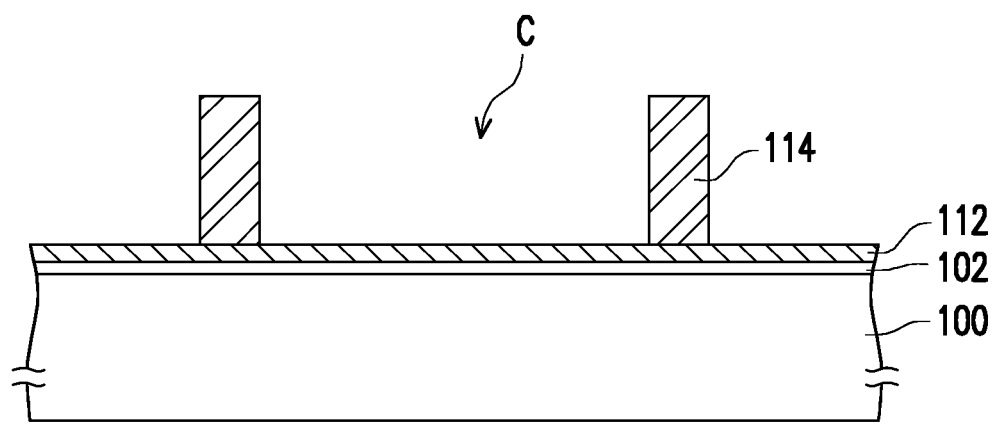
Figure 1C:
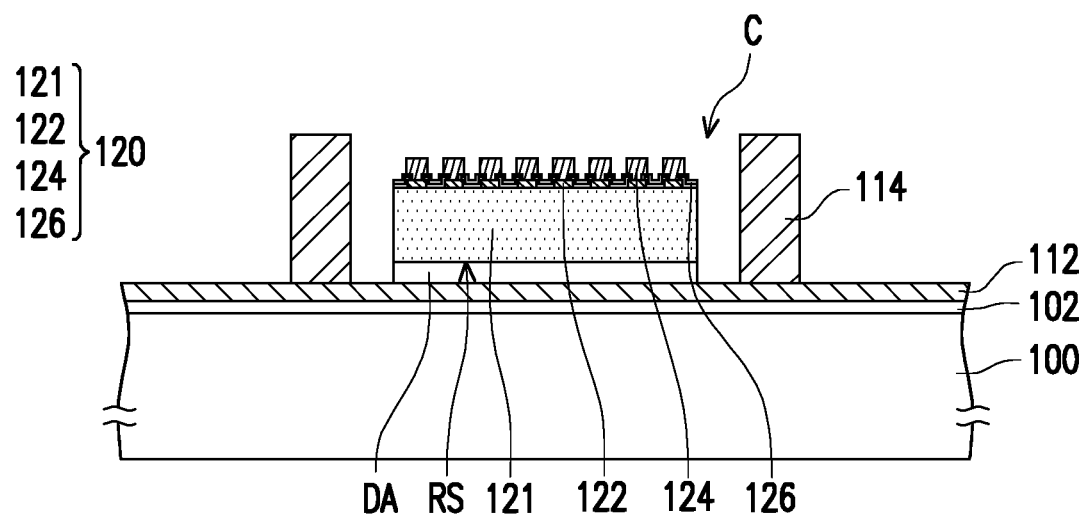
Figure 1D:
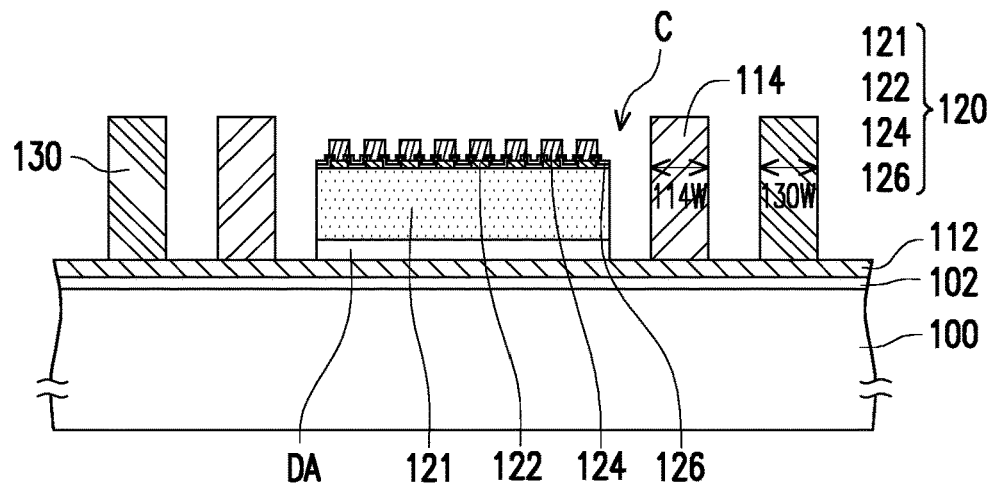
Figure 1E:
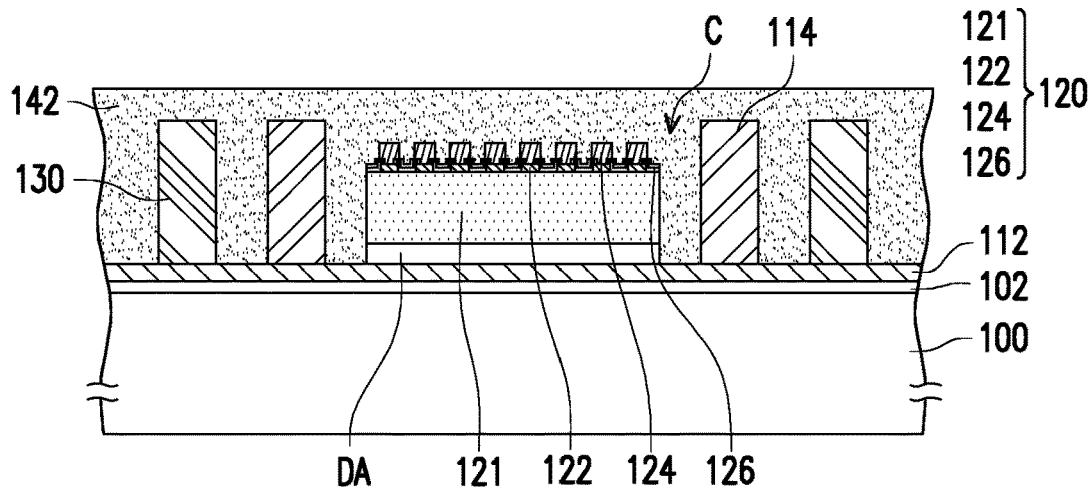
Figure 1F:
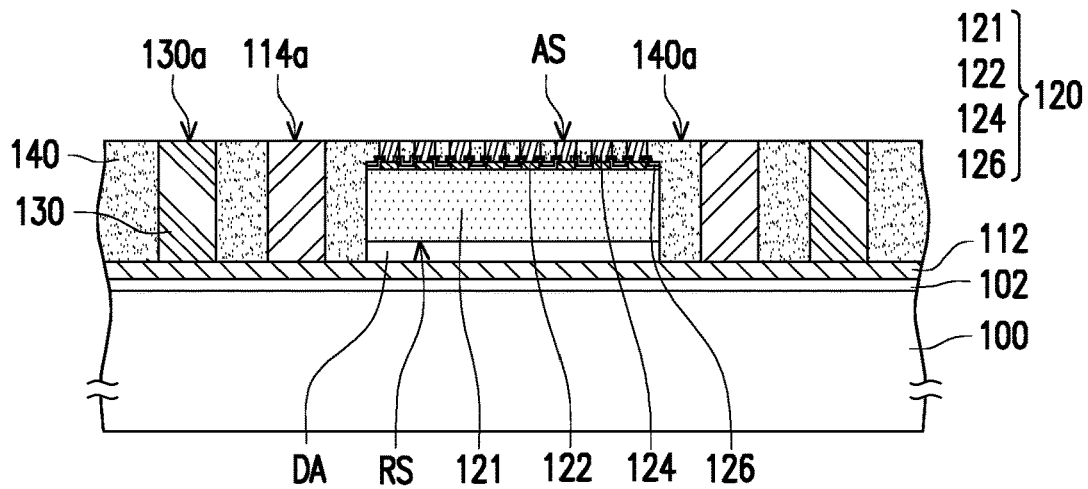
Figure 1G:
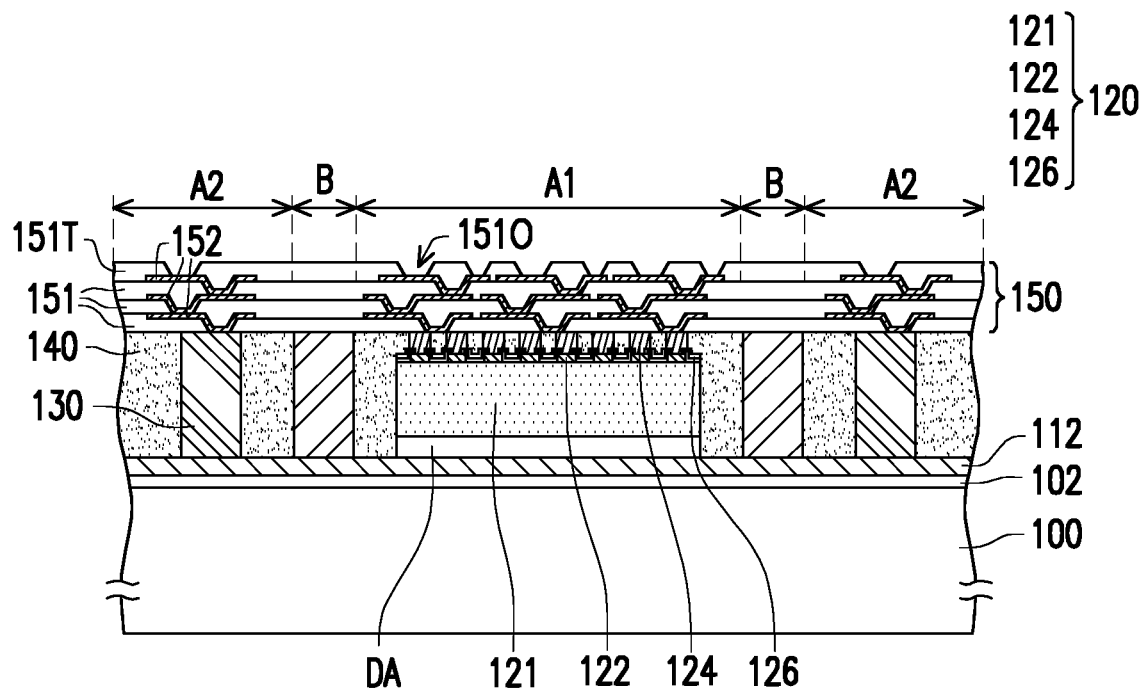
Figure 1H:
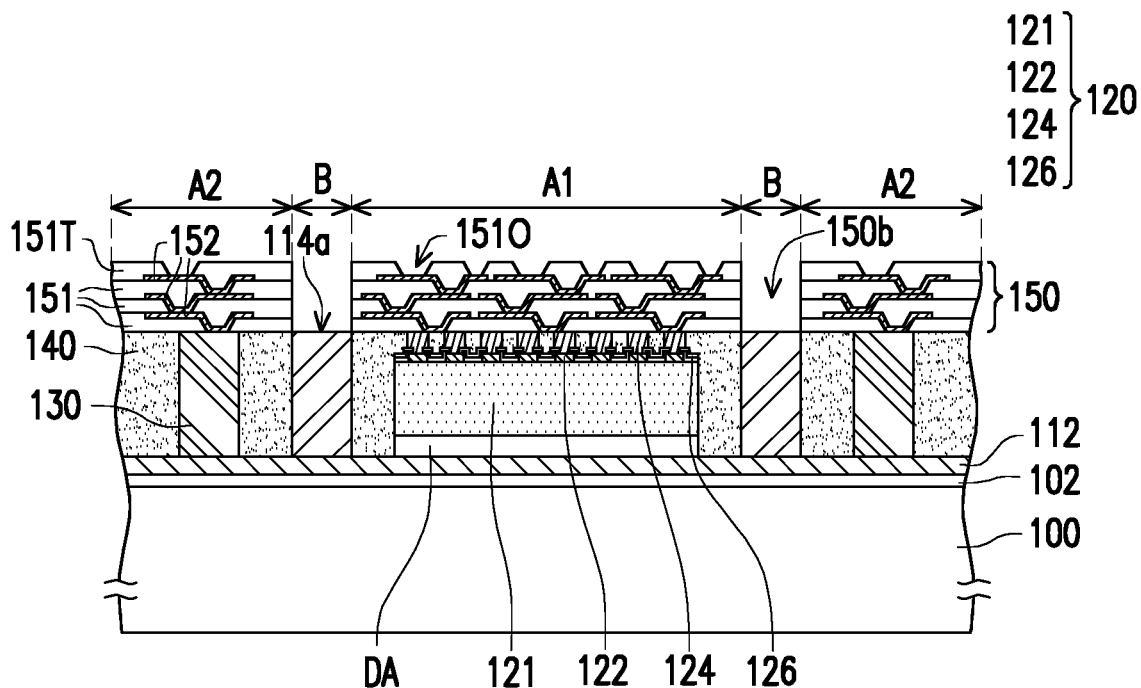
Figure 1I:
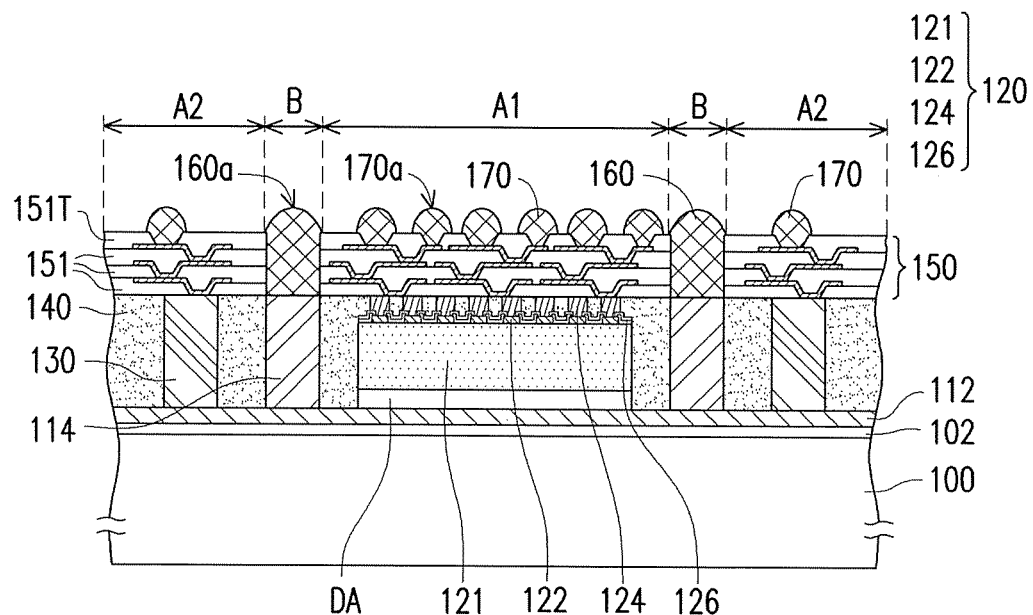
Figure 1J:
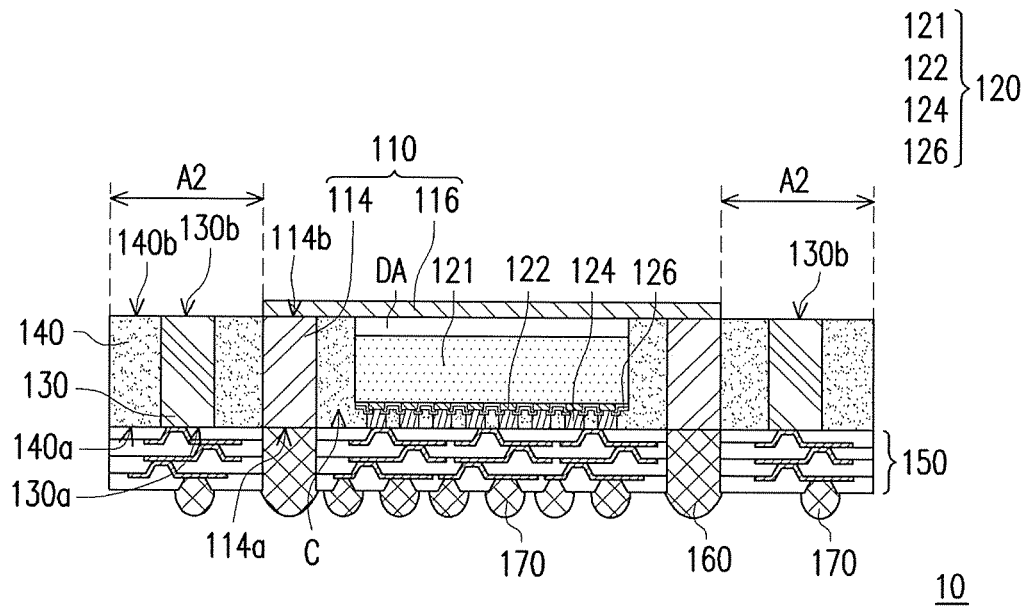
Figure 2:
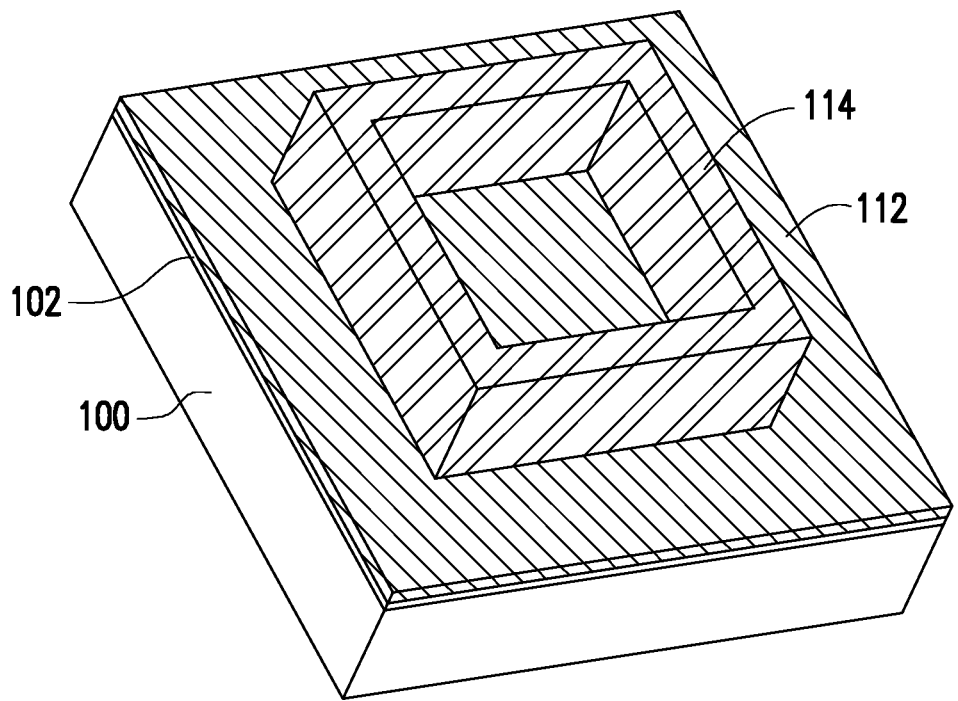
FIG. 2 is a schematic perspective top view of FIG. 1B.
Figure 3:
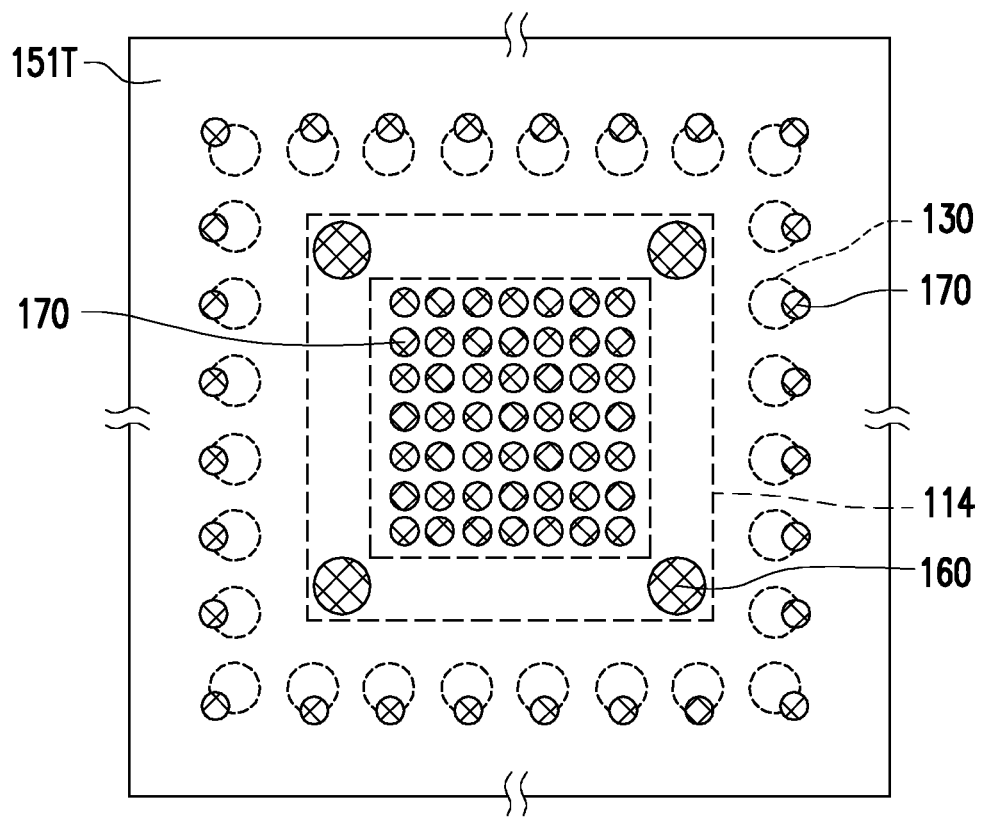
FIG. 3 is a schematic top view of FIG. 1I.

FIG. 1A to FIG. 1J are schematic cross-sectional views illustrating a manufacturing method of a semiconductor package 10 according to some embodiments of the disclosure, FIG. 2 is a schematic perspective top view of FIG. 1B, and FIG. 3 is a schematic top view of FIG. 1I. As shown in FIG. 1A, a temporary carrier 100 is provided. The temporary carrier 100 may be a substrate made of glass, plastic, metal, ceramic, or other suitable materials as long as the material is able to withstand the subsequent processes while carrying the package structure formed thereon.

In some embodiments, the temporary carrier 100 may be provided with a release layer 102 and a conductive layer 112 disposed thereon. The release layer 102 is disposed between the conductive layer 112 and the temporary carrier 100 to temporarily enhance the adhesion. When the temporary carrier 100 is later removed, the release layer 102 facilitates separation. The release layer 102 may be a layer of light-to-heat-conversion (LTHC) release coating and a layer of associated adhesive used to reduce adhesiveness when exposed to a radiation source. However, the disclosure is not limited thereto, as other suitable release layers may be used in some alternative embodiments. The conductive layer 112 includes a copper foil disposed on the temporary carrier 100. In some embodiments, a seed layer (not shown) is optionally formed on the release layer 102 prior to the copper foil. The seed layer may be a single conductive layer or a composite layer including several sub-layers of different materials (e.g., Ti/Cu layer).

Referring to FIG. 1B and FIG. 2, a conductive sidewall 114 may be formed on the conductive layer 112. The conductive sidewall 114 may be disposed on the conductive layer 112 through a pick and place process. The conductive sidewall 114 may be attached to the conductive layer 112 through conductive pastes (not shown). In another embodiment, the conductive sidewall 114 may be formed by a deposition process, a plating process, or other suitable techniques. The conductive sidewall 114 may be a closed loop (e.g. rectangular ring shape, annular shape, a polygonal ring shape, or the like) as shown in FIG. 2 to define a cavity C enclosed by the conductive sidewall 114. The conductive layer 112 forms the bottom of the cavity C. A plurality of the conductive sidewalls 114 may be arranged in an array on the temporary carrier 100. For simplicity, only one conductive sidewall 114 is shown in the exemplary embodiment. A material of the conductive layer 112 may be the same as or different from a material of the conductive sidewall 114. The material of the conductive sidewall 114 may include copper, metallic alloys, steel, a combination thereof, or other suitable conductive materials.

Referring to FIG. 1C, a semiconductor die 120 is disposed on the conductive layer 112. The semiconductor die 120 may be disposed inside the cavity C. A pick and place technique, or other suitable methods may be used to dispose the semiconductor die 120. The cavity C may be an area for accommodating the semiconductor die 120. In some embodiments, there may be a gap between the semiconductor die 120 and the conductive sidewalls 114 upon disposing the semiconductor die 120 in the cavity C. In some embodiments, a die attach layer DA may be provided between a rear surface RS of the semiconductor die 120 and the conductive layer 112 to attach the semiconductor die 120 to the conductive layer 112 and provide low die shift. The die attach layer DA may be a die attach film (DAF) or other suitable adhesive materials. In some embodiments, the die attach layer DA may include a thermal interface material (TIM) to provide good thermal dissipation.

In some embodiments, the semiconductor die 120 may include a semiconductor substrate 121, a plurality of conductive pads 122 disposed on the semiconductor substrate 121, a plurality of conductive bumps 124 electrically coupled to the conductive pads 122, and a passivation layer 126 partially covering the conductive pads 122. In some embodiments, the semiconductor substrate 121 may be a silicon substrate having active components and, optionally, passive components formed therein. The semiconductor die 120 may be a digital die, analog die or mixed signal die, such as an application-specific integrated circuit (ASIC) die, logic die, or other semiconductor device.

Referring to FIG. 1D, a plurality of conductive connectors 130 may be forming on the conductive layer 112 outside the cavity C using lithography, plating, photoresist stripping, or any other suitable processes. The conductive connectors 130 may be made of copper, aluminum, nickel, gold, a combination thereof, or other suitable conductive materials. The conductive connectors 130 may be formed by forming a mask (not shown) having openings, where the openings expose at least a portion of the conductive layer 112; disposing a conductive material to fill the openings of the mask by electroplating or deposition; and removing the mask to form the conductive connectors 130. A width 130W of each of the conductive connectors 130 may be similar, narrower, or wider than a width 114W of the conductive sidewall 114. In another embodiment, plurality of conductive connectors 130 may be formed at the same time as the conductive sidewall 114.

Referring to FIG. 1E and FIG. 1F, an insulating material 142 is formed on the conductive layer 112 to cover the conductive sidewall 114, the semiconductor die 120, and the conductive connectors 130 using an over-molding process. The insulating material 142 may be formed on the conductive layer 112 to fill the cavity C to encapsulate the semiconductor die 120 and encapsulate the conductive sidewall 114 and the conductive connectors 130. The insulating material 142 may include materials such as polymers, epoxy, molding compound or other suitable resins. After forming the insulating material 142, a thickness of the insulating material 142 may be reduced through a planarization process to form the insulating encapsulant 140. The insulating material 142 may be planarized by a chemical mechanical polish (CMP), a mechanical grinding, or other suitable process. During the planarization of the insulating material 142, a portion of the semiconductor die 120 may be removed to expose the top surfaces AS of conductive bumps 124 of the semiconductor die 120. After a planarization process, the first surfaces 130a of the conductive connectors 130, a first surface 114a (i.e. exposed surface) of the conductive sidewall 114, and the top surfaces AS of the semiconductor die 120 are exposed by the insulating encapsulant 140 and may be substantially coplanar with the first surface 140a of the insulating encapsulant 140. The insulating encapsulant 140 may cover the lateral sidewalls of the conductive sidewall 114, the semiconductor die 120, and the conductive connectors 130. In some embodiments, the height of each of the conductive connectors 130 may be substantially equal to the height of the conductive sidewall 114.

In some alternative embodiments, the conductive connectors 130 may be formed after forming the insulating material 142 through a drilling process (e.g., a laser drilling, a mechanical drilling, or other suitable techniques) to form holes in the insulating material 142. Next, the conductive material may be disposed to fill the holes of the insulating material 142. Subsequently, the insulating material 142 and the conductive material may be planarized to form the insulating encapsulant 140 and the conductive connectors 130. The conductive connectors 130 may be through molding vias (TMVs).

Referring to FIG. 1G, a redistribution structure 150 is formed on the insulating encapsulant 140. The redistribution structure 150 may be directly in contact with and electrically coupled to the conductive bumps 124 of the semiconductor die 120 and the conductive connector 130. The redistribution structure 150 includes at least one patterned dielectric layer 151 and at least one patterned conductive layer 152 stacked alternately. The patterned conductive layer 152 may be conductive features (e.g. conductive lines, conductive pads, and/or conductive vias). The patterned dielectric layer 151 may be made of inorganic or organic semiconductor dielectric materials such as polybenzoxazole (PBO), polyimide (PI), benzocyclobutene (BCB), or other suitable electrically insulating materials. The patterned dielectric layer 151 may be formed using any suitable method, such as a spin-on coating process, a deposition process, and the like.

A layer of dielectric material may be formed over the insulating encapsulant 140, the conductive connectors 130, the conductive sidewall 114 and the semiconductor die 120. Then, a portion of the dielectric material may be removed using lithography and etching process, or other suitable methods to form the patterned dielectric layer 151. The patterned dielectric layer 151 may include a plurality of openings (not illustrated) exposing portions of the conductive connectors 130, the conductive sidewall 114 and the conductive bumps 124 of the semiconductor die 120 for further electrical connection. A metal layer (not illustrated) may be conformally formed over the patterned dielectric layer 151 using a deposition process, or other suitable methods. A patterned photoresist layer (not illustrated) having openings may be formed on the metal layer. A conductive material including copper, copper alloy, aluminum, aluminum alloy, or combinations thereof, may be disposed on the metal layer inside the openings of the patterned photoresist layer using deposition, plating, or other suitable process. Thereafter, the patterned photoresist layer may be removed. The metal layer formed underneath the photoresist layer may be removed through etching or other suitable removal process. The remaining portions of the metal layer and the conductive material may form the patterned conductive layer 152.

In some embodiments, the patterned conductive layer 152 may not be formed in the area above the conductive sidewall 114. The patterned conductive layer 152 may be formed in a first routing area A1 above the semiconductor die 120 and may be in physical contact with the conductive bumps 124. The patterned conductive layer 152 may also be formed in a second routing area A2 above the conductive connectors 130 and may be in physical contact with the conductive connectors 130. A gap area B between the first routing area A1 and the second routing area A2 corresponds to the conductive sidewall 114, and the patterned conductive layer 152 may not be formed in the gap area B.

The abovementioned steps may be performed multiple times to form a multi-layered redistribution structure as required by the circuit design. The top patterned dielectric layer 151T may have openings 1510 exposing at least the portion of the top patterned conductive layer 152. A material of the top patterned dielectric layer 151T may be different from the underlying dielectric material. The top patterned dielectric layer 151T may include solder sensitive material for protecting the patterned conductive layer 152 during a ball mounting process. In some other embodiments, a portion of the patterned conductive layer 152 formed in the openings of the patterned dielectric layer 151 may be referred to as the conductive vias, and portions of the patterned conductive layer 152 formed on the patterned dielectric layer 151 may be referred to as the conductive lines and the conductive pads. The conductive pads may be electrically connected to the conductive lines through the conductive vias. The conductive pads on the top of the patterned conductive layer 152 may be under-ball metallurgy (UBM) pads.

Referring to FIG. 1H, the redistribution structure 150 includes at least one opening 150b in the gap area B penetrating through the patterned dielectric layer 151 to expose at least a portion of the first surface 114a of the conductive sidewall 114. The openings 150b may correspond to the corners or periphery of the closed-loop shaped conductive sidewall 114. In some embodiments, the opening 150b is formed in the patterned dielectric layer 151 and away from the patterned conductive layer 152. In this way, the insulating dielectric material of the patterned dielectric layer 151 is disposed between the opening 150b and the patterned conductive layer 152 to avoid short-circuit between the patterned conductive layer 152 and a conductive element subsequently formed in the opening 150b. The openings 150b of the redistribution structure 150 may be formed by laser drilling, mechanical drilling, etching, or other suitable techniques. In some embodiments, forming the openings 1510 of the top patterned dielectric layer 151T and forming the openings 150b may be performed in the same process.

Referring to FIG. 1I and FIG. 3, after forming the redistribution structure 150, first conductive terminals 160 are formed in the openings 150b of the redistribution structure 150 and the second conductive terminals 170 are formed in the openings 1510 of the top patterned dielectric layer 151T. The first conductive terminals 160 may be physically and electrically connected to the conductive sidewall 114. The first conductive terminals 160 may be formed to surround the semiconductor die 120. The first conductive terminals 160 may be correspondingly formed on the corners and/or periphery of the close-loop shaped conductive sidewall 114 as shown in FIG. 3.

The second conductive terminals 170 and/or the first conductive terminals 160 may be a ball grid array (BGA) formed by a ball placement process. In some embodiments, two stencils (not illustrated) with different sizes of holes are used to form the second conductive terminals 170 and the first conductive terminals 160. A first stencil may have larger holes than the holes of a second stencil. The holes of the first stencil may correspond to the openings 150b of the redistribution structure 150. The first stencil is provided over the redistribution structure 150. Subsequently, flux is printed on the openings 150b of the redistribution structure 150 exposed by the holes of the first stencil. Thereafter, first conductive balls (e.g. solder balls, gold balls, copper balls, nickel balls, or the like) are placed over the first stencil. The first conductive balls are subjected to a specific vibration frequency such that the first conductive balls drop into the holes of the first stencil. Afterwards, a reflow process may be performed onto the first conductive balls to form the first conductive terminals 160. The first conductive terminals 160 may be partially embedded in the redistribution structure 150 and in contact with the conductive sidewall 114. A portion of the first conductive terminals 160 may protrude from the redistribution structure 150 to further electrically couple to external electronic devices. The first conductive terminals 160 electrically coupled to the conductive sidewall 114 may be grounded through external electronic devices or directly grounded. The first conductive terminals 160 connected to the conductive sidewall 114 may provide a direct path for EMI noise instead of going through the patterned conductive layer 152 of the redistribution structure 150.

Similarly, the holes of the second stencil correspond to the openings 1510 of the top patterned dielectric layer 151T. Flux is printed on the patterned conductive layer 152 exposed by the top patterned dielectric layer 151T and the holes of the second stencil. Thereafter, second conductive balls (e.g. the size may be smaller than the first conductive balls) are placed over the second stencil and then dropped into the holes of the second stencil though a specific vibration frequency. Afterwards, a reflow process may be performed to enhance the attachment between the second conductive balls and the redistribution structure 150, thus, forming the second conductive terminals 170. A portion of the second conductive terminals 170 may be electrically coupled to the conductive connectors 130 through the redistribution structure 150, and another portion of the second conductive terminals 170 may be electrically coupled to the semiconductor die 120 through the redistribution structure 150 to electrically couple the conductive connectors 130 and the semiconductor die 120 to external electronic devices (e.g. printed circuit boards (PCBs), semiconductor packages, etc.). However, the forming sequence of the first conductive terminals 160 and the second conductive terminals 170 is not to be construed as a limit to the disclosure.

In some alternative embodiments, the first conductive terminals 160 and/or the second conductive terminals 170 may be a pillar shape. The pillar shaped conductive terminals may be formed by a plating process, or other suitable forming methods. However, other possible forms and shapes of the first conductive terminals 160 and the second conductive terminals 170 may be utilized according to design requirements. In some embodiments, a surface 160a of each of the first conductive terminals 160 and a surface 170a of each of the second conductive terminals 170 may be aligned with a standoff baseline.

Referring to FIG. 1J, after forming the first conductive terminals 160 and the second conductive terminals 170, the temporary carrier 100 and the release layer 102 may be removed to expose the conductive layer 112. The temporary carrier 100 may be detached from the conductive layer 112 through a de-bonding process. External energy such as UV laser, visible light or heat, may be applied to the release layer 102 so that the conductive layer 112 and the temporary carrier 100 can be separated. Then, the structure may be flipped (e.g. turned upside down) and placed on a holder (not shown) for subsequent processes.

A portion of the conductive layer 112 may be removed using an etching process, or other suitable techniques to form a conductive cover 116. The conductive sidewall 114 has a first surface coupled to the first conductive terminals 160 and a second surface opposite the first surface coupled to the conductive cover 116. The collective of conductive cover 116 and the conductive sidewall 114 may form a conductive casing 110. The portion of the conductive layer 112 removed may be a portion of the conductive layer 112 covering the conductive connectors 13. Upon removal, second surfaces 130b of the conductive connectors 130 opposite to the first surfaces 130a and a portion of the insulating encapsulant 140 may be exposed. After forming the conductive cover 116, a singulation process may be performed to form a plurality of semiconductor package 10 as shown in FIG. 1J.

Referring to FIG. 1J, the conductive casing 110 is disposed on the redistribution structure 150 and includes the cavity C enclosed by the conductive casing 110 and the redistribution structure 150. The cavity C of the conductive casing 110 is filled with the insulating encapsulant 140. The insulating encapsulant 140 in the cavity C encapsulates the semiconductor die 120 and the die attach layer DA. A total height of the conductive casing 110 is greater than the thickness of the insulating encapsulant 140. The semiconductor die 120 is disposed on the redistribution structure 150 and in the cavity C of the conductive casing 110 and the conductive casing 110 may be used as an electromagnetic interference (EMI) shield.

In some other embodiment, an alternative temporary carrier without the conductive layer formed thereon may be provided. The conductive sidewall may be disposed directly on the alternative temporary carrier. The same processes as described in FIG. 1C to FIG. 1I may be performed on the alternative temporary carrier. After the alternative temporary carrier is removed, the second surfaces 130b of the conductive connectors 130, a second surface 140b of the insulating encapsulant 140 and a second surface 114b of the conductive sidewall 114 are exposed. The second surface 140b of the insulating encapsulant 140 may be coplanar with the second surfaces 130b of the conductive connectors 130 and the second surface 114b of the conductive sidewall 114. The conductive cover 116 may be formed on the conductive sidewall 114 to cover the cavity C using deposition, lithography, etching processes, lamination, or any other suitable methods.

Figure 4:
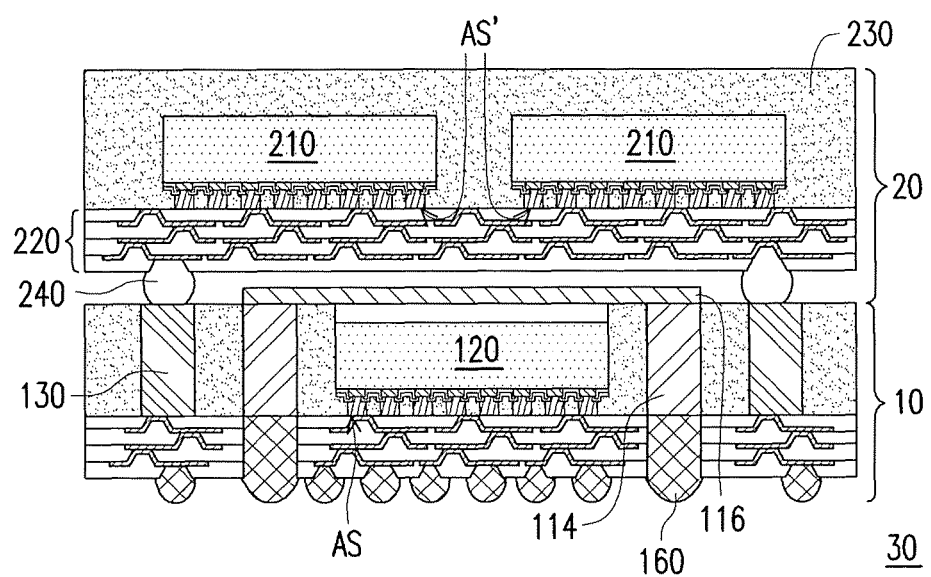
FIG. 4 is a schematic cross-sectional view illustrating an application of a semiconductor package according to some embodiments of the disclosure.

FIG. 4 is a schematic cross-sectional view illustrating an application of a semiconductor package 10 according to some embodiments of the disclosure. A semiconductor device 20 may be provided and then disposed on the conductive connectors 130 opposite to the redistribution structure 150 to form a Package-on-Package (PoP) structure 30. In some embodiments, the semiconductor device 20 may be electrically coupled to the semiconductor die 120 at least through the conductive connector 130 and the redistribution structure 150. The conductive cover 116 of the conductive casing 110 may be located between the semiconductor device 20 and the semiconductor die 120. In some embodiments, the semiconductor device 20 may be bonded to the semiconductor package 10 with conductive joints (not shown) therebetween through flip chip bonding technology and/or surface mount technology.

The semiconductor device 20 may include at least one semiconductor chip 210, a redistribution layer 220 electrically connected to the semiconductor chip 210, an insulator 230 disposed on the redistribution layer 220 to encapsulate the semiconductor chip 210, and external terminals 240 electrically connected to the redistribution layer 220 and opposite to the semiconductor chip 210. The semiconductor chip 210 may include ASIC chips, MEMS chips, memory chips, logic chips. It should be noted that the number of the semiconductor chips 210 in FIG. 4 merely serves as an exemplary illustration and the disclosure is not limited thereto. In some embodiments, the active surfaces AS' of the semiconductor chips 210 and the top surfaces AS of the semiconductor die 120 of the semiconductor package 10 may face the same direction. In some alternative embodiments, the active surfaces AS' of semiconductor chips 210 and the top surfaces AS of the semiconductor die 120 of the semiconductor package 10 may face to the opposite direction. After disposing the semiconductor device 20 on the semiconductor package 10, the external terminals 240 may be disposed and/or positioned on the conductive connectors 130 of the semiconductor package 10. A reflow process may be performed to bond the conductive connectors 130 and external terminals 240 of the semiconductor device 20. Other suitable methods may be used to attach the semiconductor device 20 onto the semiconductor package 10 to form the PoP structure 30.

As mentioned above, the conductive casing may be formed of a rigid material to provide rigidity and strength to the semiconductor package, thereby increasing the reliability of the semiconductor package. Furthermore, the conductive casing may be made of a material having low thermal capacity and high thermal dissipation, such that the conductive casing may also serve the function of heat dissipation. Additionally, the conductive casing may effectively serve the function of EMI shielding of electrical components disposed in the conductive casing. In embodiments described herein, the semiconductor die disposed in the conductive casing is shielded from EMI originating from outside the conductive casing. Furthermore, the first terminal penetrating through the redistribution structure to connect the conductive casing forms a direct path for transmitting electrical noise picked up by the conductive casing to ground. As a result, the performance of the semiconductor package may be further enhanced. Also, the conductive connector of the semiconductor package enables PoP stacked arrangements of semiconductor packages, thereby open the possibility to various product designs.

It will be apparent to those skilled in the art that various modifications and variations can be made to the embodiments and concepts disclosed herein without departing from the scope or spirit of the invention. In view of the foregoing, it is intended that the present disclosure cover modifications and variations of this invention provided they fall within the scope of the following claims and their equivalents.

What is claimed is:

1. A semiconductor package, comprising:
   a conductive casing having a cavity;
   a semiconductor die disposed in the cavity of the conductive casing;
   a conductive connector disposed on a periphery of the conductive casing;
   an insulating encapsulant encapsulating the conductive connector, the semiconductor die and the cavity, wherein the insulating encapsulant exposes a first conductive surface of the conductive casing, and the first conductive surface of the conductive casing is substantially coplanar with a first insulating surface of the insulating encapsulant;
   a redistribution structure formed on the first insulating surface of the insulating encapsulant and electrically connected to the conductive connector and the semiconductor die, wherein the redistribution structure has an opening exposing the first conductive surface of the conductive casing; and
   a first conductive terminal disposed in the opening of the redistribution structure, wherein the first conductive terminal penetrates through the redistribution structure and directly contacts the first conductive surface of the conductive casing, and a height of the first conductive terminal is greater than a thickness of the redistribution structure.

2. The semiconductor package according to claim 1, wherein the cavity of the conductive casing is defined by a conductive cover and a conductive sidewall connected to the conductive cover, the conductive cover is exposed by the insulating encapsulant, and the conductive sidewall is encapsulated by the insulating encapsulant.

3. The semiconductor package according to claim 2, wherein the height of the conductive sidewall is substantially equal to the height of the conductive connector.

4. The semiconductor package according to claim 1, further comprising:
   a die attach layer disposed in the cavity of the conductive casing and between the semiconductor die and the conductive casing.

5. The semiconductor package according to claim 1, wherein the semiconductor die comprises a top surface facing toward the redistribution structure, the top surface of the semiconductor die is substantially coplanar with the first conductive surface of the conductive casing and a surface of the conductive connector.

6. The semiconductor package according to claim 1, wherein a total height of the conductive casing is greater than a thickness of the insulating encapsulant.

7. The semiconductor package according to claim 1, wherein the cavity of the conductive casing is filled with the insulating encapsulant to encapsulate the semiconductor die.

8. The semiconductor package according to claim 1, further comprising:
   a second conductive terminal disposed on the redistribution structure opposite to the semiconductor die and outside the opening of the redistribution structure, wherein the second conductive terminal is electrically coupled to the redistribution structure.

9. The semiconductor package according to claim 8, wherein a surface of the first conductive terminal is substantially aligned with a surface of the second conductive terminal.

10. The semiconductor package according to claim 1, further comprising:
    a semiconductor device disposed on the insulating encapsulant opposite to the redistribution structure and electrically coupled to the semiconductor die.

11. A manufacturing method of a semiconductor package, comprising:
    disposing a semiconductor die in a cavity of a conductive casing;
    forming a conductive connector on a periphery of the conductive casing;
    forming an insulating encapsulant to encapsulate the conductive casing, the semiconductor die and the cavity, wherein the insulating encapsulant exposes a first conductive surface of the conductive casing, and the first conductive surface of the conductive casing is substantially coplanar with a first insulating surface of the insulating encapsulant;
    forming a redistribution structure on the first insulating surface of the insulating encapsulant, wherein the redistribution structure is electrically coupled to the conductive connector and the semiconductor die, and the redistribution structure has an opening exposing the first conductive surface of the conductive casing; and
    forming a first conductive terminal in the opening of the redistribution structure, wherein the first conductive terminal penetrates through the redistribution structure and directly contacts the first conductive surface of the conductive casing, and a height of the first conductive terminal is greater than a thickness of the redistribution structure.

12. The manufacturing method as claimed in claim 11, wherein the conductive casing comprises a conductive sidewall and a conductive cover connected to the conductive sidewall, and the manufacturing method further comprises:
    forming the conductive sidewall on a conductive layer to form the cavity before disposing the semiconductor die; and
    removing a portion of the conductive layer to form the conductive cover after forming the first conductive terminal.

13. The manufacturing method as claimed in claim 12, wherein after forming the conductive cover, the conductive cover is exposed by the insulating encapsulant, and the conductive sidewall is encapsulated by the insulating encapsulant.

14. The manufacturing method as claimed in claim 12, wherein the conductive connector is formed on the conductive layer, and after forming the conductive cover, the conductive layer connected to the conductive connector is removed.

15. The manufacturing method as claimed in claim 11, wherein the semiconductor die is provided with a die attach layer, and after disposing the semiconductor die in the cavity of the conductive casing, the semiconductor die is attached to the conductive casing through the die attach layer.

16. The manufacturing method as claimed in claim 11, wherein forming the insulating encapsulant comprises:
    forming an insulating material to cover the conductive casing, the semiconductor die and the conductive connector; and reducing a thickness of the insulating material to form the insulating encapsulant, wherein the insulating encapsulant exposes at least a portion of the semiconductor die, at least a portion of the conductive casing and at least a portion of the conductive connector.

17. The manufacturing method as claimed in claim 16, wherein after reducing the thickness of the insulating material, the first insulating surface of the insulating encapsulant is coplanar with a top surface of the semiconductor die and the first conductive surface of the conductive casing.

18. The manufacturing method as claimed in claim 11, further comprising:
    forming a second conductive terminal on the redistribution structure opposite to the semiconductor die and outside the opening of the redistribution structure, wherein the second conductive terminal is electrically coupled to the redistribution structure.

19. The manufacturing method as claimed in claim 18, wherein after the first conductive terminal and the second conductive terminal are formed, a surface of the first conductive terminal is substantially aligned with a surface of the second conductive terminal.

20. The manufacturing method as claimed in claim 11, further comprising:
    disposing a semiconductor device on the conductive connector opposite to the redistribution structure, wherein the semiconductor device is electrically coupled to the semiconductor die.

* * * * *